(12) United States Patent
Fujita

(10) Patent No.: US 7,772,035 B2
(45) Date of Patent: Aug. 10, 2010

(54) MANUFACTURING METHOD OF SEMICONDUCTOR DEVICE

(75) Inventor: Shinobu Fujita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 371 days.

(21) Appl. No.: 11/860,102

(22) Filed: Sep. 24, 2007

(65) Prior Publication Data

US 2008/0241996 A1    Oct. 2, 2008

(30) Foreign Application Priority Data

Sep. 29, 2006   (JP) .............................. 2006-269370

(51) Int. Cl.
*H01L 21/00* (2006.01)
(52) U.S. Cl. ................ 438/109; 438/107; 257/E21.001
(58) Field of Classification Search ................ 438/107, 438/109, 455
See application file for complete search history.

(56) References Cited

U.S. PATENT DOCUMENTS

| 6,387,771 | B1 * | 5/2002 | Genz et al. .................. 438/386 |
| 2006/0022293 | A1 * | 2/2006 | Welch ......................... 257/476 |
| 2007/0103833 | A1 * | 5/2007 | Harris ......................... 361/103 |

OTHER PUBLICATIONS

Shunichi Kaeriyama, et al. "A Nonvolatile Programmable Solid-Electrolyte Nanometer Switch", IEEE Journal of Solid-State Circuits, vol. 40, No. 1, Jan. 2005, pp. 168-176.
M. Oishi, et al., "Si Through Chip no Kozuo Kaumei", Nikkei Electronics, Oct. 10, 2005, pp. 81-99, Nikkei Business Publications, Inc.

* cited by examiner

*Primary Examiner*—Alexander G Ghyka
(74) *Attorney, Agent, or Firm*—Oblon, Spivak, McClelland, Maier & Neustadt, L.L.P.

(57) ABSTRACT

A manufacturing method of a semiconductor device includes preparing a first semiconductor substrate having a first integrated circuit formed therein and including a plurality of first through substrate vias, and a second semiconductor substrate having a second integrated circuit formed therein and including a plurality of second through substrate vias, forming a solid-electrolytic layer on an upper surface of the first semiconductor substrate, mounting the second semiconductor substrate on the solid-electrolytic layer such that a lower surface of the second semiconductor substrate comes into contact with the solid-electrolytic layer, and applying a voltage between the plurality of first through substrate vias and the plurality of second through substrate vias, to form in the solid-electrolytic layer a plurality of connection electrodes, which are respectively connecting the plurality of second through substrate vias adjacent to the plurality of first through substrate vias to the plurality of first through substrate vias.

7 Claims, 6 Drawing Sheets

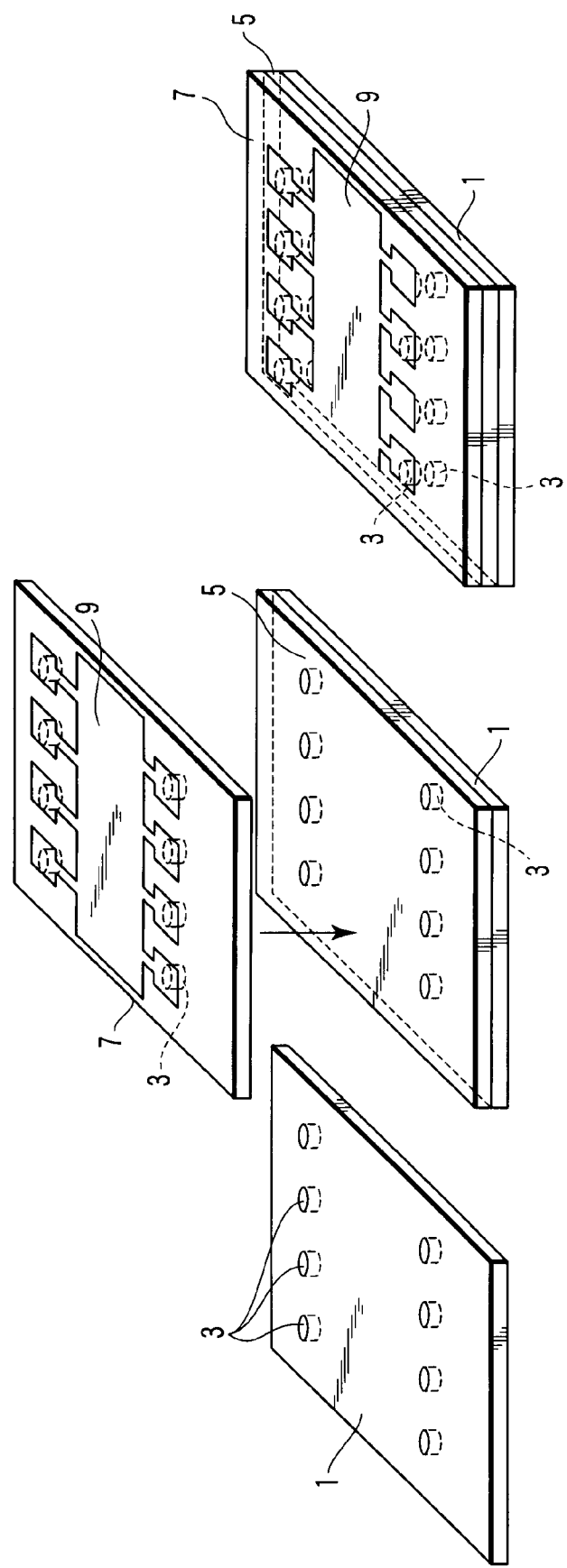

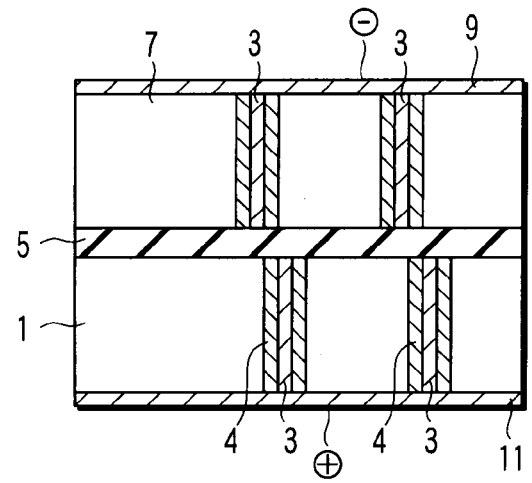
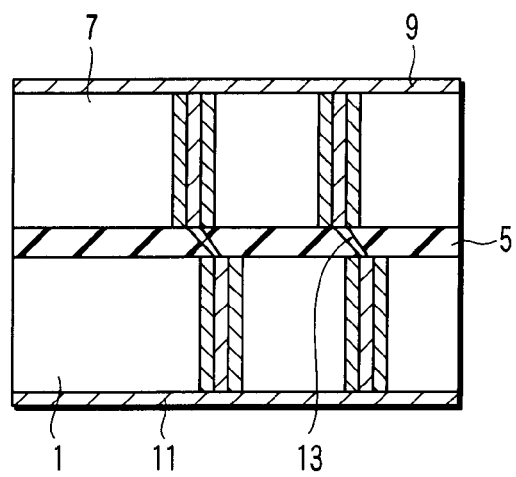
FIG. 6A  FIG. 6B
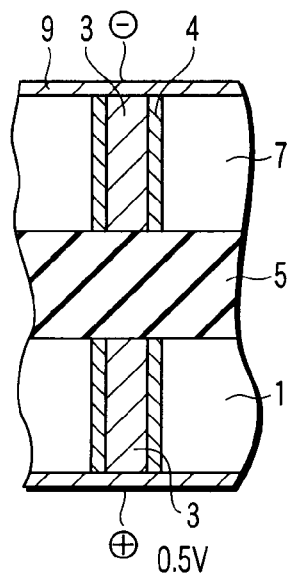
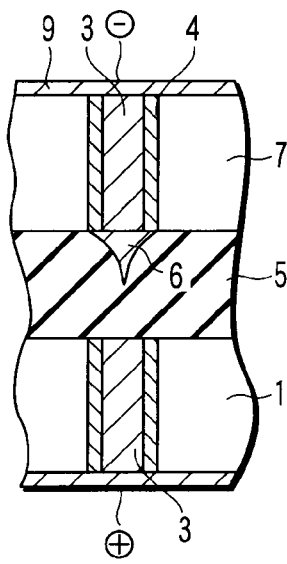
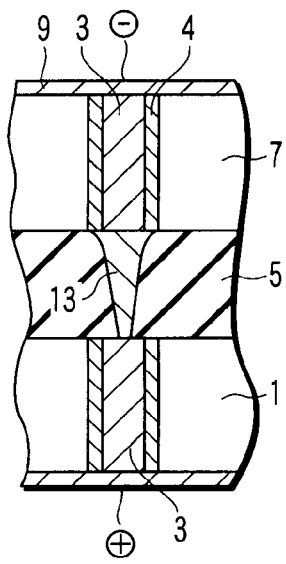
FIG. 7A  FIG. 7B  FIG. 7C

US 7,772,035 B2

MANUFACTURING METHOD OF SEMICONDUCTOR DEVICE

CROSS-REFERENCE TO RELATED APPLICATIONS

This application is based upon and claims the benefit of priority from prior Japanese Patent Application No. 2006-269370, filed Sep. 29, 2006, the entire contents of which are incorporated herein by reference.

BACKGROUND OF THE INVENTION

1. Field of the Invention

The present invention relates to a manufacturing method of a semiconductor device having a die stacking structure.

2. Description of the Related Art

An exponential increase in cost involved by miniaturization intensifies a possibility of a practical application of a three-dimensional multilayer of a circuit (a digital circuit, an analog circuit, a memory circuit, a sensor circuit, and others) that conventionally has a high cost. With such intensification, occurrence of a paradigm shift from miniaturization to realization of three-dimensionality is expected.

As effects of realization of three-dimensionality, 1) an increase in bandwidth, 2) a reduction in circuit area, 3) a reduction in wiring delay, and others can be considered. In particular, in order to realize 1), a high density of through substrate via is required. Further, in regard to 2), a density of through substrate via must be increased to efficiently perform a reduction.

As a method of increasing an electrode density in the vertical direction, a silicon substrate via has been actively proposed in recent years (see, e.g., Nikkei Electronics "Si Through Chip no Kozou Kakumei", Oct. 10, 2005, pp. 81—99 [Nikkei Business Publications, Inc.]). In this technology, after an Si wafer is scraped to have a predetermined thickness, many through holes are formed at arbitrary positions of chips aligned on the wafer, and through substrate vias are formed in these holes by a method, e.g., plating. Stacking the chips (dies) each having this through substrate via enables realizing a three-dimensional circuit which connect the chips to each other at multiple points with a minimum distance.

However, a displacement margin must be assured to connect the through substrate vias of the plurality of dies to each other, and this obstructs a reduction in circuit area. Therefore, realizing a semiconductor device manufacturing method which can form connection through substrate via with a higher density than that in a conventional die stacking structure semiconductor device is demanded.

BRIEF SUMMARY OF THE INVENTION

According to one aspect of the invention, there is provided a manufacturing method of a semiconductor device, which includes:

preparing a first semiconductor substrate which has a first integrated circuit formed therein and including a plurality of first through substrate vias, and a second semiconductor substrate which has a second integrated circuit formed therein and including a plurality of second through substrate vias;

forming a solid-electrolytic layer on an upper surface of the first semiconductor substrate;

mounting the second semiconductor substrate on the solid-electrolytic layer in such a manner that a lower surface of the second semiconductor substrate comes into contact with the solid-electrolytic layer; and applying a voltage between the plurality of first through substrate vias and the plurality of second through substrate vias, to form in the solid-electrolytic layer a plurality of connection through substrate vias, which are respectively connecting the plurality of second through substrate vias adjacent to the plurality of first through substrate vias to the plurality of first through substrate vias.

BRIEF DESCRIPTION OF THE SEVERAL VIEWS OF THE DRAWING

FIGS. 5A to 5C are schematic perspective views for explaining a manufacturing method of semiconductor device electrodes according to each of first to third embodiments;

FIGS. 6A and 6B are cross-sectional views of a semiconductor device for explaining the steps following those depicted in FIGS. 5A to 5C;

FIGS. 7A to 7C are cross-sectional views of the semiconductor device for explaining the steps of forming a connection electrode;

FIGS. 10A and 10B are schematic perspective views for explaining a power feeding method of forming electrical conduction paths of a three-dimensional circuit according to a fourth embodiment, in which FIG. 10A shows an individual power feeding method and FIG. 10 shows a fuse inserting method.

DETAILED DESCRIPTION OF THE INVENTION

Figure 1:
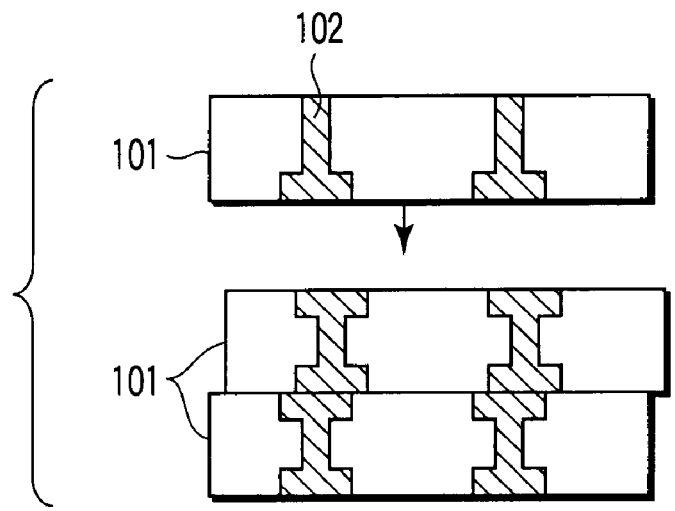
FIG. 1 is a schematic cross-sectional view for explaining an example of a conventional manufacturing method of a die stacking type semiconductor device (a first generation)
Figure 2:
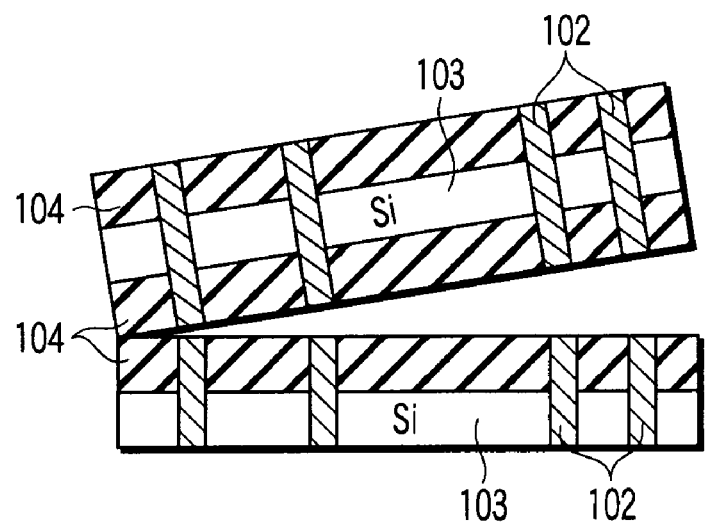
FIG. 2 is a schematic cross-sectional view for explaining another example of the conventional manufacturing method of a die stacking type semiconductor device (a second generation)

Before explaining embodiments according to the present invention, problems in a conventional technology will be summed up. FIGS. 1 and 2 show a conventional technology of forming a die stacking type semiconductor device. The technology is classified into a first generation and a second generation for the convenience's sake. In the first generation, as shown in FIG. 1, dies 101 (a structure obtained by cutting out a circuit section from a wafer) are stacked.

Before cutting out to the die, a vertical interconnect called a through substrate via 102 is formed in a predetermined process. After cutting out the die, positioning is carried out by using a mechanical alignment device. Since the error of this alignment is as large as approximately several-ten μm, the size of the vertical interconnect is approximately 50 μm square.

In the second generation, as shown in FIG. 2, each silicon wafer 103 having a circuit formed therein is bonded through an insulating film 104, and then dicing is performed with respect to each die, thereby obtaining a stacking structure. After the circuit manufacturing step, a thickness of the wafer 103 is reduced to approximately 100 µm, and hence the wafer 103 becomes semi-transparent. Therefore, optical alignment is enabled, and the error in alignment becomes smaller than the mechanical error to become several µm. The size of the through substrate via becomes approximately 5 µm square.

Figure 3:
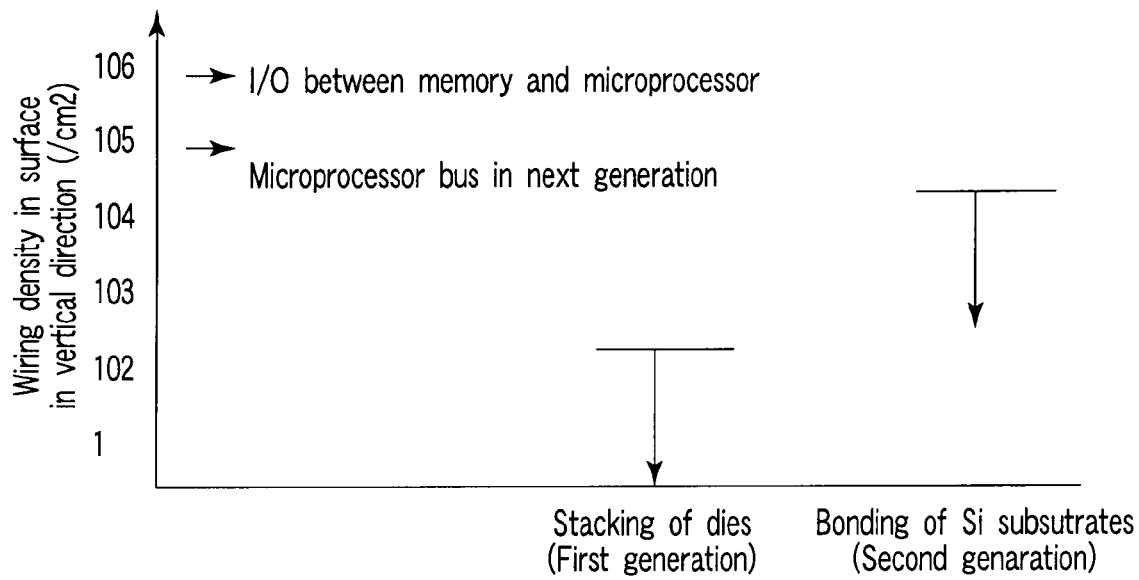
FIG. 3 is a schematic view showing a wiring density in a surface in a vertical direction required for each generation or each application.

A total area of the through substrate via itself is considered as 1% in the entire circuit at the utmost. Therefore, assuming that the area of one through substrate via is S, a density of through substrate via is 1/100 S. FIG. 3 shows this density. That is, the density is $2.5 \times 10^2/cm^2$ in the technology of the first generation, and it is $2.5 \times 10^4/cm^2$ in the technology of the second generation. They are smaller than an through substrate via density required in an application. For example, $10^5/cm^2$ or above is ideally required in a bus of a next-generation microprocessor, and $10^6/cm^2$ or above is required in an interface I/O that directly connects a memory to a processor element.

Figure 4:
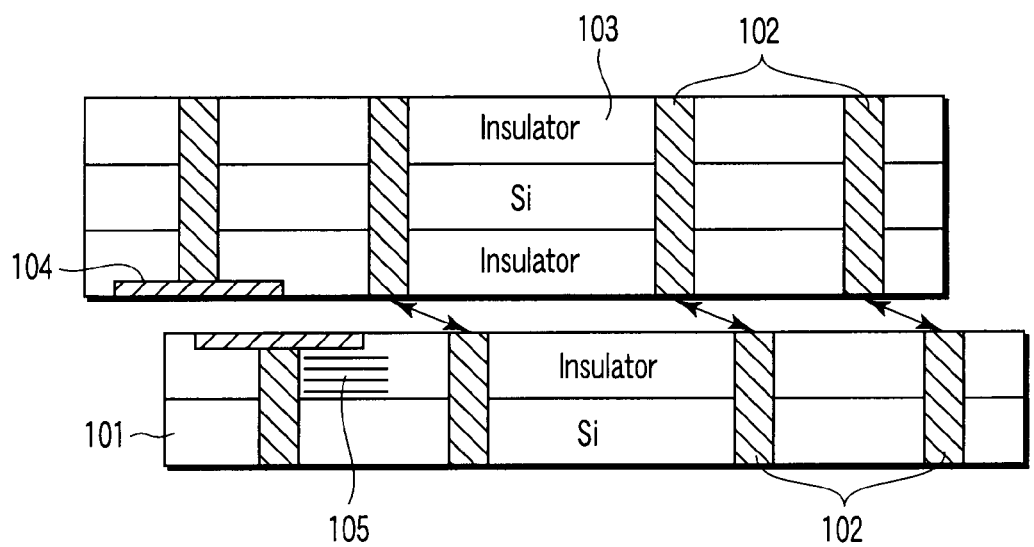
FIG. 4 is a schematic cross-sectional view of a semiconductor device for explaining problems when a huge plug is provided.

A problem in the conventional technology lies in that an alignment accuracy is low and a through substrate via density cannot be increased. In order to solve this problem, providing a huge plug 104 at a connection end of the through substrate via can be considered as shown in FIG. 4. However, when the huge plug 104 is provided, a problem of an interference with a neighboring wiring line 105 or an increase in a coupling capacitance occurs. Therefore, each through substrate via 102 must be formed apart from a transistor or a wiring area.

Alternatively, if there is a process that enables bonding the through substrate vias with each other by self-alignment, a displacement in alignment can be allowed. Therefore, each through substrate via (or each pad) with a small size can be formed. As means for solving this problem, the following method can be considered. That is, a special insulating film on which a low-resistance layer can be locally formed at a position to which a voltage is applied is provided between dies or wafers, and applying a voltage to a space between through substrate vias that should be bonded with each other enables bonding the through substrate vias with each other by self-alignment. Embodiments according to the present invention based on such an idea will now be explained hereinafter.

First Embodiment

FIGS. 5A to 5C and FIGS. 6A and 6B are schematic views showing a manufacturing process of a semiconductor device connection electrode according to a first embodiment of the present invention in stages. First, a first die 1 with a thickness of 100 µm having an integrated circuit formed therein by a regular silicon process is created, and then through holes each having a diameter of 50 µm are formed by dry etching and vapor phase growth. Through substrate vias 3 are formed by, e.g., Cu plating to fill the through holes. A metal thin-film layer (not shown in FIGS. 5A to 5C) of, e.g., Cu or Ag that is apt to be ionized is formed with a thickness of 0.05 µm on each through substrate via surface by a sputtering method. Then, the die is cut out by a known dicing method (FIG. 5A).

Subsequently, a CuS layer 5 that is a solid-electrolytic layer is formed on a surface of the die (FIG. 5B). Specifically, a Cu layer with a thickness of 1 µm is deposited, and a Cu surface is immersed in an electrolytic solution including a sulfur ion. A positive voltage is applied to a side opposite to a surface where a Cu electrode is provided, and a negative electrode is immersed in the electrolytic solution to provoke an electrochemical reaction, thereby providing CuS. On this stage, the CuS layer is an insulating film.

Then, a second die 7 with a thickness of 100 µm having an integrated circuit formed therein like the first die 1 is mechanically aligned on the CuS layer 5 by a standard method. Subsequently, heating is performed at 400° C. for several minutes so that the die 7 and the CuS layer 5 are bonded to each other (FIG. 5C). It is to be noted that reference numeral 9 on a surface of the second die 7 denotes a surface electrode connected to each through substrate via 3, and it is used for energization at the next step.

Furthermore, as shown in FIG. 6A, a rear surface electrode 11 connected to each through substrate via 3 is also formed on a rear surface of the first die 1. Subsequently, applying a voltage to a space between the front surface electrode 9 and the rear surface electrode 11 to connect the upper and lower through substrate vias 3 to each other through connection electrodes 13. A method of forming this connection electrode 13 will now be explained hereinafter with reference to FIGS. 7A to 7C.

First, as shown in FIG. 7A, when a voltage of 0.5V is applied to a space between the rear surface electrode 11 and the front surface electrode 9, a Cu ion is ion-conducted through the CuS layer 5 and reaches the upper through substrate vias 3, and then electrons are captured to be precipitated as a metal Cu 6 (FIG. 7B). When this process is performed for several seconds, the precipitated Cu ion reaches the lower through substrate vias 3 to form each connection electrode 13 (FIG. 7C), and the upper and lower through substrate vias 3 are thereby electrically connected to each other. When this process continues, the size of the connection electrode 13 is further increased, and the electrical resistance of the connection electrode 13 is lowered. Since a lower resistance of a through substrate via is desirable, application of the voltage is continued until the electrical resistance becomes lower than a desired value. It is to be noted that the front surface electrode 9 is removed by, e.g., the chemical mechanical polishing (CMP) method after electrical conduction of the through substrate vias 3.

Adopting the method of connecting the through substrate vias 3 to each other by self-alignment as explained above can reduce the size of each through substrate via 3 to 5 µm square. As a result, a through substrate via density is determined based on an alignment accuracy≅50 µm, and a gap between the through substrate vias is approximately double this value (≅100 µm). Therefore, the through substrate via density becomes $10^4/cm^2$, and it is approximately 40-fold of a counterpart in the conventional technology.

Moreover, when the front surface electrode 9 on the second die and the rear surface electrode 11 on the first die are removed by etching and the above-explained steps are repeated, a three-dimensional multilayered circuit can be formed.

As explained above, according to the first embodiment, since the through substrate vias are connected to each other by self-alignment, the through substrate vias can be formed with a higher density than that in the conventional die stacking type semiconductor device.

Second Embodiment

A manufacturing process of a semiconductor device according to the second embodiment will be explained with reference to FIGS. 5A to 5C and 7A to 7C since it is similar to that according to the first embodiment.

First, after a first die 1 with a thickness of 50 to 100 µm having an integrated circuit formed therein by a conventional silicon process is created, through substrate vias 3 are formed like the first embodiment. A metal thin-film layer 4 of, e.g., Ag or Cu is formed with a thickness of 0.1 µm on a surface of each through substrate via 3. Then, a ZnCdS polycrystal is sublimed by sputtering at an ordinary temperature to form a thin-film of a ZnCdS layer 5 as a solid-electrolytic layer with a thickness of 1 μm on a surface of the die 1. At this stage, the ZnCdS layer 5 is an insulating layer.

Then, a second die 7 which includes an integrated circuit and has a front surface electrode 9 formed thereon to be connected to each through substrate via 3 is aligned on the ZnCdS layer 6 by an optical aligner, and then heating is performed at 400° C. for several seconds to bond the second die 7 with the ZnCdS layer 6 (FIG. 5A). Subsequently, a rear surface electrode 11 is formed on a rear surface of the first die 1 (FIG. 2(*a*)). Subsequently, when a voltage of 0.5V is applied to a space between the front surface electrode 9 and the rear surface electrode 11 (FIG. 7A), an Ag or Cu ion reaches the upper through substrate vias 3 by ionic conduction through the ZnCdS layer 5, and then electrons are captured to be precipitated as a metal Ag (FIG. 7B). When this process continues for a several second, the precipitated Ag ion reaches the lower through substrate vias 3, and the upper and lower through substrate vias 3 are thereby electrically connected to each other (FIG. 7C). When this process continues, the size of each connection electrode 13 is further increased, and the electrical resistance of the connection electrode is lowered. Since a lower resistance of a through substrate via is desirable, application of a voltage continues until the electrical resistance becomes lower than a desired value.

Adopting the method of connecting the through substrate vias 3 to each other by self-alignment as explained above enables reducing the area of each through substrate via 3. As a result, a through substrate via density is determined by an alignment accuracy about 5 μm, and a gap between the through substrate vias is approximately double this value (≅10 μm). Therefore, the through substrate via density is $10^6/cm^2$, and becomes 40-fold of a counterpart in the conventional technology. When the front surface electrode 9 on the second die 7 and the rear surface electrode 11 on the first die 1 are removed by, e.g., CMP and the above-explained steps are repeated, a three-dimensional multilayered circuit can be formed.

As explained above, according to the second embodiment, the three-dimensional circuit having the through substrate vias with a high density exceeding that in the first embodiment can be provided.

Figure 8:
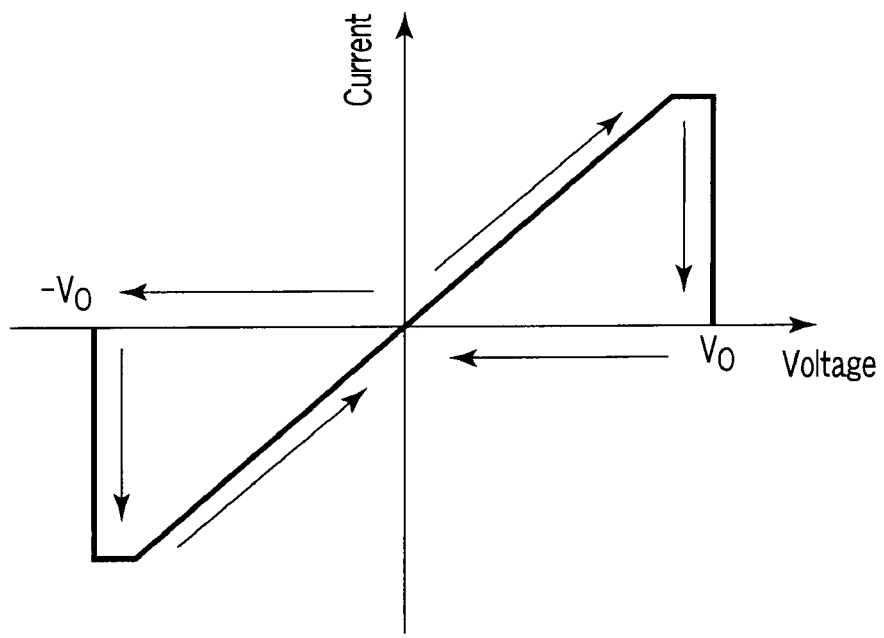
FIG. 8 is a characteristic view for explaining a hysteresis of voltage/current characteristics of a solid electrolyte.
Figure 9:
FIG. 9 is a characteristic view showing a relationship between a thickness of the solid-electrolytic layer and a maximum operating voltage.

Incidentally, it is known that the solid electrolyte (CuS or ZnCdS) used in the first and second embodiments has a hysteresis in voltage/current characteristics as shown in FIG. 8, and a maximum application voltage V0 is determined based on a film thickness of the solid-electrolytic layer. FIG. 9 is a view showing a relationship between the thickness of the solid-electrolytic layer and the maximum application voltage, and determining the thickness and connection electrode forming voltage while considering workability, electrical characteristics, and others suffices.

Third Embodiment

Besides the solid electrolyte, there is a thin-film material enabling formation of a low-resistance electroconductive path by application of an appropriate voltage. This is conventionally examined for a non-volatile memory application. A third embodiment uses the thin-film material in place of the solid-electrolytic layer 5 explained in the first and second embodiments.

(1) GeSbTe: an amorphous phase (high resistance) in an initial state can be changed to a polycrystal layer (low resistance) by applying a voltage to the upper and lower sides of a film to perform energization.

(2) A transition metal oxide (NiO, SrTiO, PrCaMnO, TiO, TaO and others): an insulator phase in an initial state can be subjected to electrical phase transition to be thereby change to the metal phase (low-resistance layer) by applying a voltage to the upper and lower sides of a film.

In the case of GeSbTe, using vapor phase growth to form a thin-film layer with a film thickness of 1 μm on a first semiconductor substrate can suffice. Further, in the case of the transition metal oxide, using a magnetron sputtering method to form a thin-film layer with a film thickness of 1 μm on the first semiconductor substrate can suffice. When NiO is used, it is good enough to use Ag or Ni as a coating metal thin film layer 4 for through substrate vias.

As explained above, the third embodiment can likewise enable forming through substrate vias with a higher density than that in the conventional technology.

Fourth Embodiment

In the manufacturing method of a semiconductor device according to each of the first to third embodiments, all through substrate vias 3 may not possibly turned on at the same time. That is, in an example where the front surface electrode 9 is used as shown in FIG. 5C, when one through substrate via 3 is turned on, a voltage is not applied to both ends of each of the other through substrate vias 3. Methods of solving this problem will now be explained in a fourth embodiment.

Figure 10A:
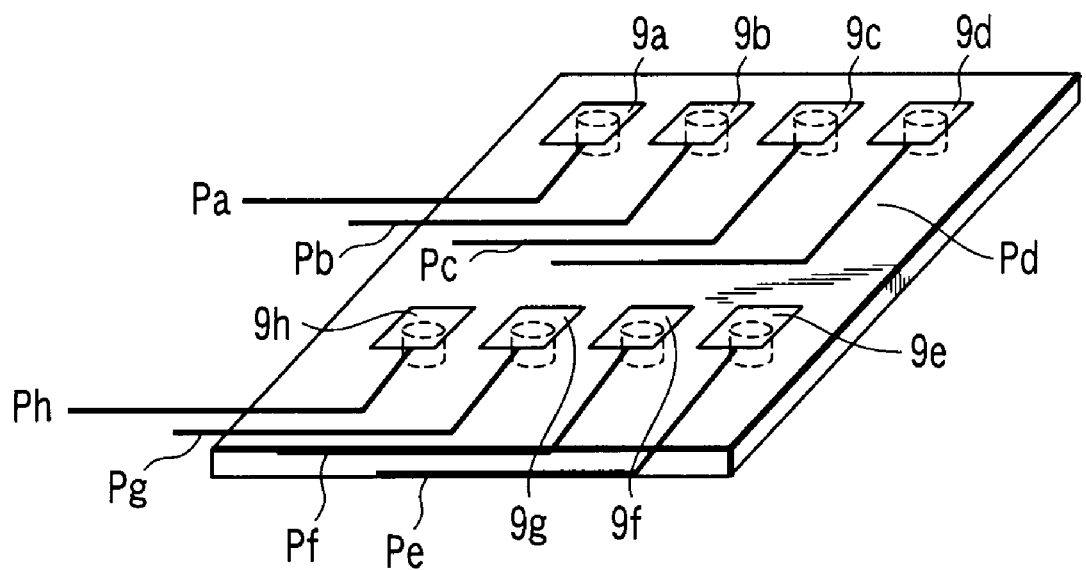
Figure 10B:
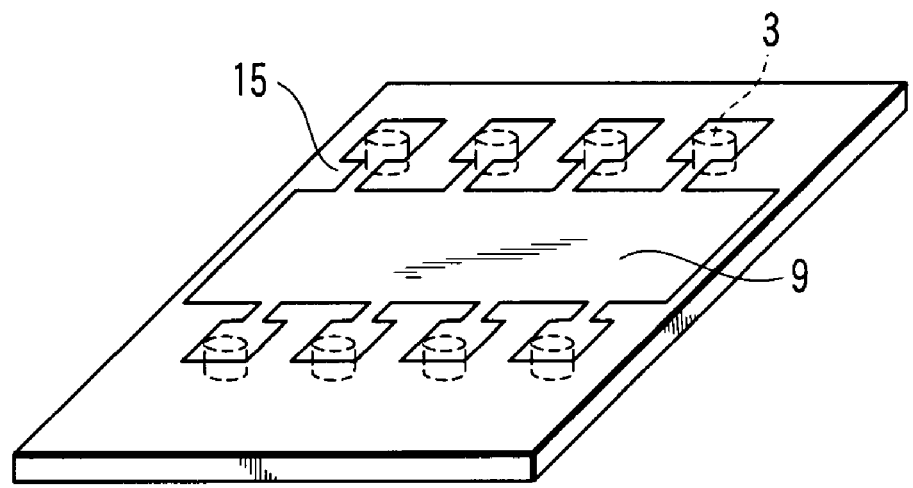

In a first method, as shown in FIG. 10A, pad electrodes 9*a* to 9*h* and power supplies Pa to Ph are individually prepared in accordance with respective through substrate vias 3. In a second method, as shown in FIG. 10B, a fuse structure 15 is utilized. That is, a fuse 15 with a width of sub μm and a thickness of several-ten nm is provided between a front surface electrode 9 and each through substrate via 3. When one through substrate via is turned on and a large current flows, a corresponding fuse 15 is automatically turned off. Adopting the above-explained structure enables all the through substrate vias 3 to be turned on.

As explained above, according to the embodiments, the semiconductor device manufacturing method which can form connection of through substrate via with a higher density than that by a conventional die stacking method can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor device, comprising:

preparing a first semiconductor substrate which has a first integrated circuit formed therein and including a plurality of first through substrate vias, and a second semiconductor substrate which has a second integrated circuit formed therein and including a plurality of second through substrate vias;

forming a transition metal oxide layer on an upper surface of the first semiconductor substrate;

mounting the second substrate on the transition metal oxide layer in such a manner that a lower surface of the second semiconductor substrate comes into contact with the transition metal oxide layer; and applying a voltage between the plurality of first through substrate via and the plurality of second through substrate via, to form in the transition metal oxide layer a plurality of connection electrodes, which respectively connect the plurality of second through substrate vias adjacent to the plurality of first through substrate vias to the plurality of first through substrate vias.

2. The method according to claim 1, wherein the transition metal oxide layer is an insulating layer including one selected from the group consisting of NiO, SrTiO, and PrCaMnO.

3. The method according to claim 2, wherein the plurality of connection electrodes are formed of a low-resistance layer including one selected from the group consisting of NiO, SrTiO, and PrCaMnO.

4. The method according to claim 1, wherein the transition metal oxide layer includes NiO, and the first and second through substrate vias are covered with Ag or Ni.

5. The method according to claim 1, further comprising:

forming an upper electrode connected to the second through substrate vias on an upper surface of the second semiconductor substrate; and forming a lower electrode connected to the first through substrate vias on a lower surface of the first semiconductor substrate, wherein said forming the plurality of electrical conduction paths includes applying the voltage between the upper electrode and the lower electrode.

6. The method according to claim 5, wherein the upper electrode includes fuses, each formed between each of the plurality of second through substrate vias and the upper electrode, and one of the fuses through which a current flows is blown out and the current flows through the rest of the plurality of second through substrate vias in said applying the voltage between the upper electrode and the lower electrode.

7. The method according to claim 5, wherein the upper electrode is formed of a plurality of pad electrodes, which are respectively connected to the plurality of through substrate vias.

* * * * *